(12) United States Patent  
Punzenberger et al.

(10) Patent No.: US 7,078,961 B2
(45) Date of Patent: Jul. 18, 2006

(54) DEVICE AND METHOD FOR CALIBRATING R/C FILTER CIRCUITS

(75) Inventors: Manfred Punzenberger, Villach (AT); Bernhard Schaffer, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/839,850

(22) Filed: May 6, 2004

(65) Prior Publication Data

US 2004/0260500 A1 Dec. 23, 2004

(30) Foreign Application Priority Data

May 12, 2003 (DE) ................. 103 21 200

(51) Int. Cl.
*H03K 5/00* (2006.01)
(52) U.S. Cl. ..................... 327/553; 327/552
(58) Field of Classification Search ......... 327/552–559
See application file for complete search history.

(56) References Cited

U.S. PATENT DOCUMENTS

| 4,785,253 | A | * | 11/1988 | Hughes ..................... 327/553 |
| 4,791,379 | A | | 12/1988 | Hughes |
| 4,851,719 | A | | 7/1989 | Hitomi |
| 5,187,445 | A | | 2/1993 | Jackson |
| 5,416,438 | A | | 5/1995 | Shibata |
| 5,822,687 | A | | 10/1998 | Bickley et al. |
| 5,914,633 | A | * | 6/1999 | Comino et al. ............. 327/553 |
| 5,994,951 | A | * | 11/1999 | Mazhar et al. ............. 327/553 |
| 6,417,727 | B1 | | 7/2002 | Davis |
| 6,570,412 | B1 | * | 5/2003 | Yamazaki ................... 327/103 |
| 6,677,814 | B1 | * | 1/2004 | Low et al. .................. 327/554 |
| 6,803,813 | B1 | * | 10/2004 | Pham ......................... 327/553 |
| 6,842,710 | B1 | * | 1/2005 | Gehring et al. ............. 702/107 |
| 2002/0067220 | A1 | | 6/2002 | Horng et al. |

FOREIGN PATENT DOCUMENTS

DE 101 56 027 A1 6/2003
EP 0 910 165 A2 4/1999

* cited by examiner

*Primary Examiner*—Dinh T. Le
(74) *Attorney, Agent, or Firm*—Eschweiler & Associates, LLC

(57) ABSTRACT

A calibration unit is designed to contain an oscillator circuit whose frequency is determined by the RC time constant of a resistor, which is of the same type as the resistor used in the filter circuit that is to be calibrated, and of a capacitor device which has been set to a fixed value. The oscillator frequency is converted into counting pulses, and the number of counting pulses which is counted in a modulo binary counter within a time interval is transmitted as a digital calibration signal for a calibratable capacitor device in the filter circuit in order to calibrate the latter.

12 Claims, 3 Drawing Sheets

DEVICE AND METHOD FOR CALIBRATING R/C FILTER CIRCUITS

REFERENCE TO RELATED APPLICATIONS

This application claims the benefit of the priority date of German application DE 103 21 200.0 filed on May 12, 2003, the contents of which are herein incorporated by reference in their entirety.

FIELD OF THE INVENTION

The present invention relates to a device and a method for calibrating analogue filter circuits. In this context, the invention refers to a calibration unit for generating a calibration signal, to a calibratable filter device comprising a filter circuit and a calibration unit connected thereto, and also to a method for generating a calibration signal.

BACKGROUND OF THE INVENTION

In many electronic circuits, particularly in the field of communications technology, such as mobile radio technology, analogue continuous-time filter circuits are used. These frequently require the observance of cut-off frequencies in the range of tolerance of a few percent. This demand cannot be met without calibration, since the absolute values of integrated passive components (R and C) are subject to relatively large fluctuations related to technology. The same problem also arises for analogue time-delay elements if greater accuracy is demanded than can be provided by the technology.

One fundamental way of solving this problem is to trim the resistor and capacitor elements during production, although this has revealed that such a practice is very cost-intensive. In addition, the components produced and trimmed in this manner do not allow the equalization of temperature influences and drift during operation.

For this reason, filter circuits are manufactured using calibratable resistor or capacitor elements. The calibratability is usually produced by virtue of either a number of resistors that can be added in any combination being connected in series or parallel with the resistor element or a number of capacitors that can be added in any combination being connected in parallel with the capacitor element. The information about which resistors or capacitors need to be added in order to produce optimum filter properties is contained in a calibration signal that is generated in a calibration unit.

The calibration unit is usually part of the integrated circuit, which contains a reference RC element containing the same resistor and capacitor types as are used in the filter circuit that is to be calibrated. Before the filter circuit is started up, a voltage step at the level V is applied to the RC element, discharged beforehand, and the RC time constant is ascertained from the step response. FIG. 1 shows the profile v(t) for the step response in a voltage/time graph. The present level v(t) of the step response is compared with a fixed value v1. If this fixed value is exceeded at the time t1, the time measurement is stopped and the time that has elapsed is stored digitally. The time measurement is usually carried out using a binary counter clocked at a precise reference frequency fr.

The step response v(t) for an RC element is $V \times (1-\exp(-t/(RC)))$, so that it holds that $v1=V \times (1-\exp(-t1/(RC)))$.

The RC product can thus be clearly ascertained from V, v1 and the period t1 which can be measured using the frequency normal fr. It holds that $RC=t1/(-\ln(1-(v1/V)))$. The product RC is proportional to t1. For $v1=V \times (0.632)$, $R \times C=t1$.

To calibrate integrated filters to the desired cut-off frequency fg, all R or all C in the filter need to be set to be proportional to 1/t1 in accordance with a factor K, since the frequency fg is proportional to 1/RC. Setting R or C is done using digitally programmable R or C elements, where b is the number of programming bits and the setting is possible in a particular range $RC_{min} \ldots RC_{max}$.

The printed document U.S. Pat. No. 5,416,438 shows a filter arrangement as portrayed in principle above. This filter arrangement has, on a common semiconductor chip, a time-constant detector circuit and an active filter circuit that is controlled by the detector circuit. The detector circuit is made up of a time-constant circuit, containing a resistor and a capacitor, for generating a step-response signal, a reference voltage circuit for generating a reference voltage, a comparator, an AND gate, a four-bit pulse counter and an encoder for converting the count result into a calibration signal. The comparator is supplied with the step-response signal at its first input and with the generated reference voltage at its second input. The AND gate is supplied with the output signal from the comparator at its first output and with a reference clock at its second input. The AND gate continues to output reference clock pulses to the pulse counter only for as long as it receives an output signal from the comparator. As soon as the step-response signal outstrips the reference voltage, however, the output signal from the comparator changes to zero, which means that the AND gate no longer delivers reference clock pulses to the counter. The number of clock pulses counted by the counter is thus a measure of the RC time constant of the time-constant circuit if the reference voltage and the components are proportioned as described further above with reference to FIG. 1. The encoder supplies the active filter circuit with a three-bit calibration signal that can be used in two different variants to add three further resistors in series or parallel with the resistor used in the filter circuit.

An arrangement which is similar in principle is illustrated in the printed document U.S. Pat. No. 6,417,721 B1, where provision is made for the capacitor used in the active filter circuit to be able to have further capacitors connected in parallel with it under the control of the calibration signal. Further similar calibration arrangements and methods can be found in the printed documents US 2002/0067220 A1, U.S. Pat. No. 5,822,687 and U.S. Pat. No. 5,187,445.

In application, the calibratability of the active filter circuit is usually provided by calibratable capacitor elements, the calibration signal being a b-bit binary number and being applied to the calibratable capacitor elements in the active filter circuit via a b-bit parallel bus. The calibratable capacitor elements are usually binary-weighted switchable capacitor cascades. The calibration of the resistor elements in the active filter circuit as used in the first-mentioned printed document above is less customary on account of the corruption of the binary-weighted resistor values by the switches, and is relatively complex on account of the usually relatively large number of resistor elements.

A drawback of the prior art described above is that the reference RC element needs to have a correspondingly high RC time constant, which means that the time t1 can be measured at a resolution of >b bits for a given reference frequency fr. The magnitude of RC may necessitate an increased chip area, which increases the manufacturing costs for the circuit. In addition, a digital arithmetic and logic unit with multiplication and division is required, or at least a value table containing appropriately calculated correction values, in order to calculate the factor K. This is sometimes not wanted on purely analogue chips. Finally, interference and noise can corrupt the measurement of t1, since v(t) and v1 are compared only once by the comparator.

SUMMARY OF THE INVENTION

It is accordingly an object of the present invention to specify a device and a method that allow the provision of calibration for an active filter circuit during operation while reducing the cost involvement and improving accuracy.

This object is achieved by the features of the independent patent claims. Advantageous developments and refinements are specified in the subclaims.

A fundamental concept of the present invention is that an oscillator is constructed from reference components in order to ascertain a calibration signal. It is assumed that it is necessary to calibrate a filter circuit that has resistor means, capacitor means and amplifier means. Accordingly, the invention refers to a calibration unit for generating a calibration signal for calibrating the filter circuit, where the calibration unit has an oscillator circuit that contains reference resistor means, reference capacitor means and reference amplifier means. The oscillator circuit oscillates at a frequency that is determined essentially by the RC time constant of the reference resistor means and of the reference capacitor means. The calibration unit also has means for generating the calibration signal on the basis of the frequency of the oscillator circuit.

In one preferred embodiment of the inventive calibration unit, the oscillator circuit also comprises comparator means for generating counting pulses. In this case, the oscillator circuit is designed such that an output on the resistor means is coupled to an input on the amplifier means and to an input on the capacitor means, an output on the amplifier means is coupled to an output on the capacitor means and to an input on the comparator means, where the input of the resistor means can have two different constant electrical supply potentials connected to it, and where the comparator means are connected to the calibration-signal generating means.

The invention has the advantage that measuring a frequency instead of the inversely proportional time constant makes the use of an arithmetic and logic unit or of a table superfluous. Instead, simple counting means, such as a binary counter, are needed within the calibration-signal generating means in order to count the counting pulses which are output by the comparator means.

The reference RC element contained in the oscillator circuit does not require a large time constant dependent on external variables, such as the reference clock, and thus permits a relatively great degree of freedom in its proportioning.

A further advantage of the invention is that noise and other interfering influences no longer have such a critical effect on the comparator means, because periodic comparisons repeatedly reduce the uncorrelated errors.

The invention also affords the option of concurrently calibrating any influences by the amplifier means on the filter cut-off frequency, if appropriate.

One advantageous and preferred embodiment is in a form such that the comparator means have a first and a second comparator, where the first input of the first comparator is supplied with the first supply potential, and its second input is coupled to the output of the amplifier means, and where the first input of the second comparator is supplied with the second supply potential, and its second input is coupled to the output of the amplifier means. In this case, the output of the first comparator is also connected to a first input, and the output of the second comparator is connected to a second input, on a flip-flop, and the output of the flip-flop is connected to the control input of a changeover switch which has two inputs for supplying the supply potentials and an output which is connected to the resistor means.

In addition, this embodiment may have provision for the output of the first comparator to be connected to the first input of an OR gate and for the output of the second comparator to be connected to the second input of the OR gate, and for the output of the OR gate to be connected to the calibration-signal generating means. To a certain extent, the OR gate thus has the task of combining the counting pulses coming from the two comparators on a single line and of supplying them to the calibration-signal generating means. The calibration-signal generating means can then also have an AND gate, time-interval generating means and counting means, and the output of the OR gate can be connected to a first input on the AND gate, and an output on the time-interval generating means can be connected to a second input on the AND gate, and the output of the AND gate can be connected to the counting means. This makes it possible to count just the counting pulses that arise within a time interval generated by the time-interval generating means.

The time-interval generating means may be provided by a binary counter whose input is connected to the reference-clock generating means. The size of the binary counter is preferably chosen such that its most significant storage location can provide an output signal having the desired time interval.

The counting means are preferably provided by a binary counter, particularly a modulo binary counter. A modulo binary counter is a binary counter which is intended to count modulo ($2^b$). This is explained is more detail further below.

The amplifier means in the filter circuit and the reference amplifier means in the calibration unit can respectively be provided by an operational amplifier.

The present invention likewise refers to a calibratable filter device which comprises a filter circuit containing resistor means, capacitor means and amplifier means, where the resistor means and/or the capacitor means are calibratable, in particular are configurable or alterable in terms of circuitry, and the filter device also comprises a calibration unit (described above) in line with the invention whose output is connected to an input on the calibratable resistor and/or capacitor means in the filter circuit.

The present invention also refers to a method for generating a calibration signal for calibrating a filter circuit that contains resistor means, capacitor means and amplifier means. The method involves an oscillation being generated in an oscillator circuit which contains reference resistor means, reference capacitor means and reference amplifier means, a signal representing the oscillation frequency being ascertained, and a calibration signal being derived therefrom and supplied to the filter circuit.

In one preferred development, periodic counting pulses are generated from the oscillator circuit's oscillation and are counted, and the calibration signal is derived from the number of counting pulses that are within a time interval. In this case, the time interval can be generated in this manner by supplying a reference clock signal to a binary counter of suitable size, so that a signal with the period of the time interval can be tapped off at an output on the most significant storage location in the binary counter.

The counting pulses can be counted using a binary counter, particularly a modulo binary counter, as will be explained in more detail further below.

BRIEF DESCRIPTION OF THE DRAWINGS

The text below gives a more detailed illustration of an exemplary embodiment of an inventive calibration unit and a corresponding inventive method for generating a calibration signal for calibrating a filter circuit with reference to the figures, in which.

DETAILED DESCRIPTION OF THE INVENTION

Figure 1:
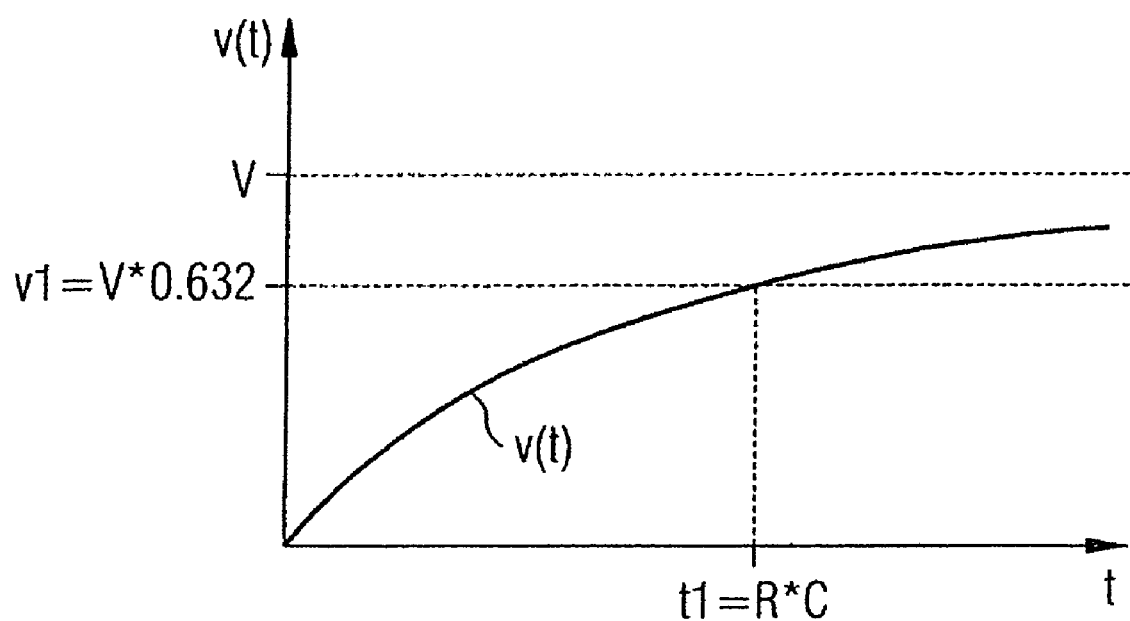
FIG. 1 shows the waveform for the step response of an RC element.
Figure 2:
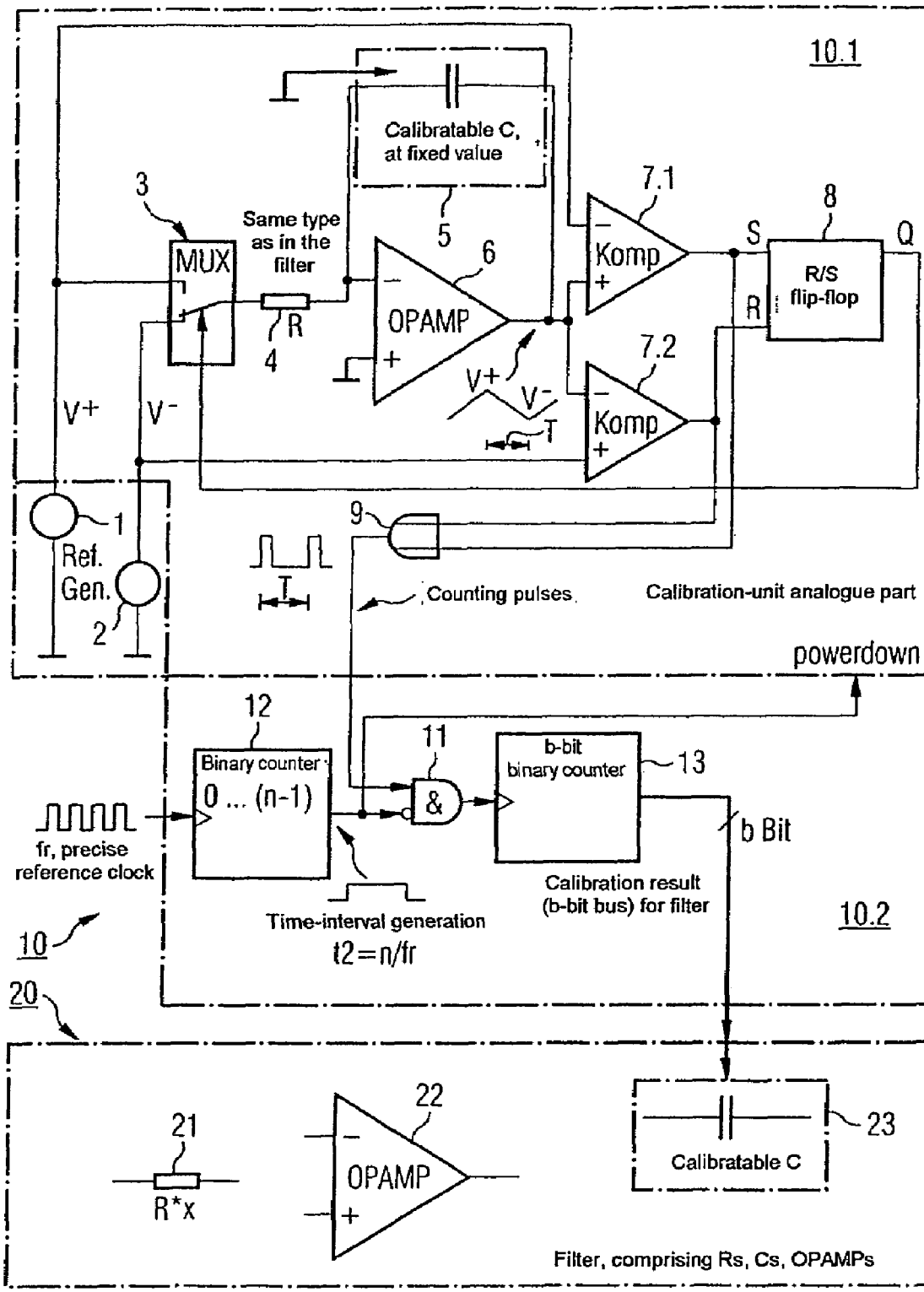
FIG. 2 shows a block diagram of an embodiment of an inventive calibratable filter device which contains a calibration unit and a filter circuit.

The embodiment of the calibratable filter device shown in FIG. 2 has a calibration unit 10 and a filter circuit 20 that receives a digital calibration signal of word length b from the calibration unit 10. The filter circuit 20 contains one or more (x) resistors (R) 21, an operational amplifier 22 and a calibratable capacitor device 23 which can be in the form of a digitally actuatable arrangement of parallel-connected capacitors which can be added as desired, like the capacitor device shown in FIG. 4 of the patent specification U.S. Pat. No. 6,417,727 mentioned at the outset, for example.

The calibration unit 10 can be divided into an analogue part 10.1 and a digital part 10.2. The digital part 10.2 comprises the calibration-signal generating means mentioned further above.

In the analogue part 10.1, two reference voltage sources 1 and 2 provide the electrical supply potentials V+ and V− and deliver them to the two inputs of a changeover switch 3 (MUX). The changeover switch 3 has just one output and can connect to its output in response to a control signal at one of the two supply potentials V+ or V−. The output of the changeover switch 3 is connected to a resistor 4(R) that is of the same type as the resistors 21(R) used in the filter circuit. The output side of the resistor 4 is connected both to a capacitor device 5 and to the first input of an operational amplifier 6. The capacitor device 5 can, in principle, likewise be calibratable, but is set to a fixed value during operation and for generating a calibration signal that can be supplied to a particular filter circuit. The second input of the operational amplifier 6 is connected to a quiescent potential. The output of the capacitor device 5 is connected to the output of the operational amplifier 6. The operational amplifier 6 is of the same type as the operational amplifier 22 used in the filter circuit 20.

The output of the operational amplifier 6 is also connected to the first ("+") input of a first comparator 7.1, while the second ("−") input of the comparator 7.1 is supplied with the supply potential V+ from the reference voltage source 1. The first ("+") input of a second comparator 7.2 is supplied with the supply potential V− from the reference voltage source 2, while the second ("−") input of the second comparator 7.2 is connected to the output of the operational amplifier 6.

The output of the first comparator 7.1 is supplied to the Set input of an R/S flip-flop switch 8, while the output of the second comparator 7.2 is supplied to the Reset input of the R/S flip-flop switch 8. The Q output of the flip-flop switch 8 is transmitted in the form of a control signal to the changeover switch 3.

The reference voltage generators 1 and 2, the changeover switch 3, the resistor 4, the capacitor device 5, the operational amplifier 6, the comparators 7.1 and 7.2 and the R/S flip-flop switch 8 form an oscillator circuit.

The oscillator circuit's oscillation frequency is determined by the RC time constant of the resistor 4 and of the capacitor device 5. If the changeover switch 3 connects the resistor 4 to the first supply potential V+, then the potential at the output of the operational amplifier 6 rises in the direction of supply potential V+ at a speed of rise which is determined by the RC time constant of the resistor 4 and of the capacitor device 5. While the potential at the output of the operational amplifier 6 is below the supply potential V+, the output signal from the first comparator 7.1 is equal to zero. However, the effect of the operational amplifier 6 pulls the potential at its output above the supply potential V+. At this moment, the first comparator 7.1 outputs an output signal and sets the R/S flip-flop switch 8, so that the Q output changes its digital switching state and thus prompts the changeover switch 3 to change over to the supply potential V−.

Next, the same method is now used, but with the opposite direction, to pull the output of the operational amplifier 6 in the direction of the supply potential V−. As soon as the potential at this point drops below the supply potential V−, the second comparator 7.2 outputs a signal, and this signal is used to reset the R/S flip-flop switch 8. Hence, the digital signal state at the latter's Q output changes and the changeover switch 3 is changed over to the supply potential V+ again, so that the cycle starts from the beginning.

The two comparators 7.1 and 7.2 respectively output short pulses at the reversal points of the oscillation in the oscillator circuit with the period 2T. The outputs of the comparators 7.1 and 7.2 are connected to the two inputs of an OR gate 9. In this way, the pulse trains delivered by the comparators 7.1 and 7.2 are combined on a single line and provide a pulse train of counting pulses having the period T.

In the digital part 10.2 of the calibration unit, the counting pulses are supplied to a first input on an AND gate 11. The second input of the AND gate 11 is supplied with a square-wave signal which represents a time interval t2 within which the number of counting pulses needs to be counted. The square-wave time interval is generated using a first binary counter 12 whose counting input is supplied with a reference clock signal fr. The time interval to be generated needs to have a length of n reference clock pulses, so that t2=n/fr. The desired, inverted time-interval square-wave signal is provided at the output of the most significant memory location (n−1) in the binary counter 12. This signal is input into the second input of the AND gate 11 (=powerdown signal from the oscillator). The top two timing diagrams in FIG. 3 show the reference clock signal fr and the time interval t2.

The output of the AND gate 11 thus provides only the counting pulses which are within the time interval t2. These are supplied to a second binary counter 13 at its counting input. During the fixed time interval t2=n/fr, the oscillator circuit thus generates m periodic counting pulses which are detected by the binary counter 13 having a width of b bits. The b-bit binary counter 13 is preloaded with a fixed value k prior to the calibration. The binary counter 13 may overflow a plurality of times during the calibration interval. The counter value is m modulo ($2^b$). m0 modulo ($2^b$) is the neutral programming value for the calibratable capacitor device 23 in the filter circuit 20 (for an ideal nominal value of the RC product in the technology). The possible calibration range of the calibratable capacitor device 23 is 0 ... ($2^{b-1}$).

Figure 3:
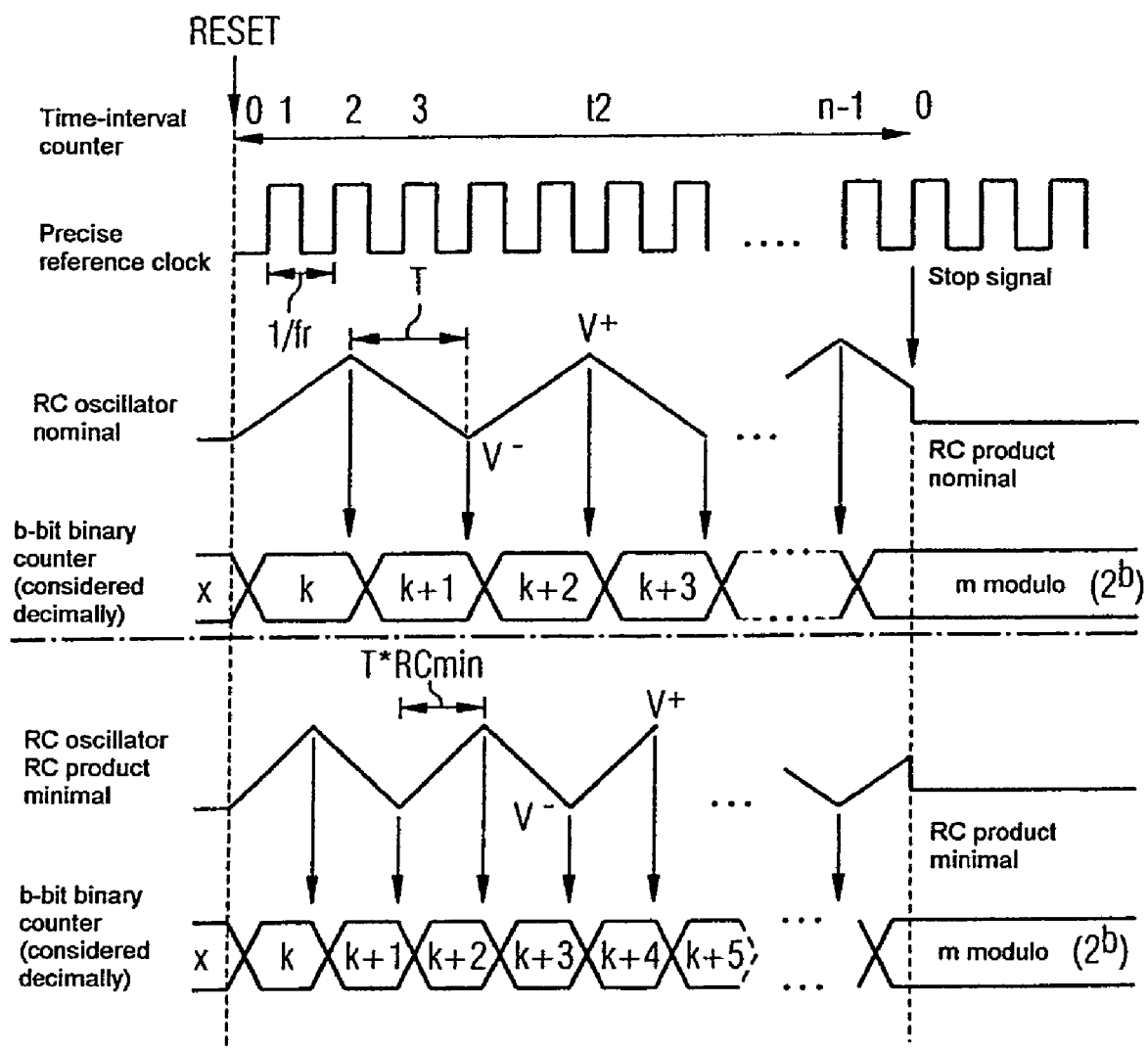
FIG. 3 shows the waveform for various signals during operation of the filter device shown in FIG. 2.

FIG. 3 shows the waveforms for the oscillator oscillation and the associated curves for the counter reading on the b-bit binary counter 13.

Otherwise, the following further definitions apply:

The variables b, k, m0, n are natural numbers, where m0 needs to be rounded.

T0 is the nominal product of R and C in the oscillator circuit and, in principle, is freely selectable, with an order of magnitude which corresponds to the values R and C which occur in the filter circuit being advantageous.

RCmax is the normalized maximum value of the RC product in line with the production tolerances (of the integrated circuit) and RCmin is the normalized minimum value. It is assumed, without losing general validity, that Rcmax=1/RCmin. This defines the nominal value as the geometric mean of the two limit values, as is valid for many technologies. If this relationship does not apply, RCmax or RCmin needs to be expanded for the calibration, so that it holds that RCmax=1/RCmin.

The values of m0 and n are ascertained on the basis of fr, b, T and normalized RCmax as follows:

$n/fr = T0 \times m0$ for R and C nominal $n/fr = [m0 + 2^{(b-1)}] \times T0/RCmax$ for R and C minimal.

The above relationships give:

$m0 = [2^{(b-1)}]/(RCmax - 1)$ $n = T0 \times m0 \times fr$.

The value k for preloading the binary counter is ascertained as follows:

For m=m0 counting pulses when calibration has been performed, a counter reading of $2^{(b-1)} - 1$ is desired in order to put the calibratable capacitor device 23 in the filter circuit 20 into a neutral setting. This setting is usually in digital form $2^{(b-1)}$. The smallest k>0 needs to be chosen, so that it holds that: $(k+m)$ modulo $(2^b) = 2^{(b-1)} - 1$ (the smallest k>0 is chosen in order to obtain a result after a minimal number of counter overflows).

This is explained in more detail using the following numerical exemplary embodiment:

Let b=4 bits, fr=20 MHz, RCmax=1.3 and T=400 ns nominal

The capacitor device 23 in the filter circuit 20 can be calibrated using a 4-bit parallel bus proportionally to 1/1.3 ... 1.3 around the nominal value.

It holds that $m0 = [2^{(b-1)}]/(RCmax - 1)$, where m0=8/[1.3−1]~27 (rounded).

It also holds that $n = T \times m0 \times fr$, which means that n=400 ns×27×20 MHz=216, which corresponds to a calibration interval of n/fr=216/20 MHz=10.8 μs.

Let k=12, which means (k+m0) modulo $(2^b) = 2^{(b-1)} - 1$ is satisfied.

Hence, (12+27) modulo 16=39 modulo $16 = 2^{(4-1)} - 1 = 7$.

In the text below, it is assumed that the normalized RC product in the technology differs from the nominal value by the factor 1.3 as a result of spread. The RC product in the oscillator is thus increased by the factor 1.3, and the RC oscillator now generates only m/1.3 counting pulses in the calibration interval n/fr. The frequency f of an RC sawtooth oscillator is proportional to 1/(RC).

After 27/1.3~20 counting pulses+preload value k=12, the counter reading following calibration is (27/1.3+12) modulo 16~32 modulo 16=0 (all figures decimal, rounded down to whole numbers).

In this case, 0 corresponds to the minimum value 1/1.3 that can be set on the capacitor device. Hence, the normalized RC product in the filter is 1.3/1.3=1.0, and the filter is exactly calibrated.

In the text below, it is assumed that the normalized RC product in the technology differs from the nominal value by the factor 1/1.3 as a result of spread. Hence, the RC product in the oscillator is reduced by the factor 1/1.3, and the RC oscillator generates m×1.3 counting pulses in the calibration interval n/fr.

After 27×1.3~35 counting pulses+preload value k=12, the counter reading after calibration is (27×1.3+12) modulo 16~47 modulo 16=15 (all figures decimal, rounded down to whole numbers).

In this case, 15 corresponds to the maximum value 1.3 which can be set on the capacitor device. Hence, the normalized RC product in the filter is (1/1.3)×1.3=1.0, and the filter is exactly calibrated.

The 4-bit quantization error means that the calibration can fluctuate by ±(1.3−1.0)/16 between the extreme values. This corresponds to a fluctuation error of ±1.9%.

The invention is not limited to the circuit implementation of the embodiment in FIG. 3. Instead, the analogue part 10.1 of the calibration unit 10 may contain an RC sawtooth oscillator having just one comparator, which is changed over to and fro. In addition, the RC oscillator and the comparators may also be of fully differential design. Instead of using an RC sawtooth oscillator, an RC sine oscillator may also be used.

The invention claimed is:

1. A calibration unit for generating a calibration signal for calibrating a filter circuit that has resistor means, capacitor means and amplifier means, wherein the calibration unit comprises:
   an oscillator circuit comprising reference resistor means, reference capacitor means and reference amplifier means; and
   means for generating the calibration signal such that the calibration signal is functionally related to a frequency of the oscillator circuit, wherein the means for generating the calibration signal is operatively coupled to the oscillator circuit, wherein:
   the oscillator circuit further comprises comparator means for generating comparator output pulses based on the frequency of the oscillator circuit,
   an output of the reference resistor means is coupled to an input of the reference amplifier means and to an input of the reference capacitor means, an output of the reference amplifier means is coupled to an output of the reference capacitor means and to an input of the comparator means,
   the input of the reference resistor means is selectively coupled to one of two different constant electrical supply potentials, and
   the comparator means is connected to the calibration-signal generating means.

2. The calibration unit of claim 1, wherein the calibration-signal generating means comprises counting means for counting the comparator output pulses which are output by the comparator means.

3. The calibration unit of claim 1, wherein:
the comparator means comprises a first comparator and a second comparator,
a first input of the first comparator is supplied with the first supply potential, and a second input is coupled to the output of the reference amplifier means,
a first input of the second comparator is supplied with the second supply potential, and a second input is coupled to the output of the reference amplifier means,
an output of the first comparator is connected to a first input of a flip-flop, and an output of the second comparator is connected to a second input of the flip-flop, and
an output of the flip-flop is connected to a control input of a changeover switch that has two inputs for the supply potentials and an output that is connected to the reference resistor means.

4. The calibration unit of claim 3, wherein:
the output of the first comparator is connected to a first input of an OR gate and the output of the second comparator is connected to a second input of the OR gate, and
an output of the OR gate is connected to the calibration-signal generating means.

5. The calibration unit of claim 4, wherein:
the calibration-signal generating means comprises an AND gate, time-interval generating means and counting means,
the output of the OR gate is connected to a first input of the AND gate, and an output of the time-interval generating means is connected to a second input of the AND gate, and
an output of the AND gate is connected to the counting means.

6. The calibration unit of claim 5, wherein the time-interval generating means comprises a binary counter having an input connected to reference-clock generating means.

7. The calibration unit of claim 5, wherein the counting means comprises a binary counter.

8. The calibration unit of claim 1, wherein the amplifier means and the reference amplifier means comprise an operational amplifier, respectively.

9. A method for generating a calibration signal for calibrating a filter circuit that contains resistor means, capacitor means and amplifier means, comprising:

generating an oscillation signal in an oscillator circuit that contains reference resistor means, reference capacitor means and reference amplifier means;
ascertaining an oscillation frequency of the oscillation signal;
deriving a calibration signal that is functionally related to the oscillation frequency of the oscillation signal; and
supplying the calibration signal to the filter circuit, wherein the ascertaining the oscillation frequency comprises:
generating periodic counting pulses from the oscillation signal; and
counting the counting pulses within a predetermined time interval,
wherein the calibration signal is derived from a number of comparator output pulses counted within the time interval.

10. The method of claim 9, wherein the comparator output pulses are counted using a binary counter.

11. A calibration circuit for calibrating a filter circuit, comprising:
an oscillator circuit configured to generate an oscillating signal having a frequency associated with a reference resistance and a reference capacitance; and
a calibration signal generation circuit operatively coupled to the oscillator circuit and configured to generate a multi-bit digital calibration signal that is functionally related to the frequency of the oscillating signal of the oscillator circuit, wherein the oscillator circuit comprises:
an operational amplifier configured in an inverting, integrator configuration with the reference resistance and the reference capacitance, respectively, and operable to generate a sawtooth waveform having a slope that is a function of the reference resistance and the reference capacitance; and
a comparator circuit configured to receive the sawtooth waveform from the operational amplifier and output a pulse when the sawtooth waveform reaches an upper or a lower threshold.

12. The calibration circuit of claim 11, wherein the calibration signal generation circuit comprises a counter that counts the pulses from the comparator circuit during a predetermined time interval, wherein a number of pulses corresponds to the frequency of the oscillating signal.

* * * * *